(12) United States Patent
Paraschiv et al.

(10) Patent No.: US 12,259,442 B2
(45) Date of Patent: Mar. 25, 2025

(54) APPARATUS AND METHOD FOR TESTING A CELL CONTACT OF BATTERY CELLS OF A BATTERY MODULE

(71) Applicant: Acculogic Inc., Markham (CA)

(72) Inventors: Bogdan Paraschiv, Toronto (CA); Karim Dehkordi, Trabuco Canyon, CA (US)

(73) Assignee: Acculogic Inc., Markham (CA)

( * ) Notice: Subject to any disclaimer, the term of this patent is extended or adjusted under 35 U.S.C. 154(b) by 283 days.

(21) Appl. No.: 17/866,657

(22) Filed: Jul. 18, 2022

(65) Prior Publication Data
US 2023/0384388 A1    Nov. 30, 2023

(30) Foreign Application Priority Data

May 27, 2022   (DE) .......................... 102022113467.9

(51) Int. Cl.
*G01R 31/385* (2019.01)
*G01R 31/36* (2020.01)
(Continued)

(52) U.S. Cl.
CPC ....... *G01R 31/389* (2019.01); *G01R 31/3644* (2013.01); *G01R 31/385* (2019.01);
(Continued)

(58) Field of Classification Search
CPC .... G01R 31/389; G01R 31/385; G01R 31/66; G01R 31/3644; G01R 33/066; H01M 10/4285; H01M 10/482
(Continued)

(56) References Cited

U.S. PATENT DOCUMENTS

| 8,570,047 B1 * | 10/2013 | Davies | H02J 7/0019 324/426 |
| 2006/0132141 A1 * | 6/2006 | Dougherty | B60L 58/16 324/435 |

(Continued)

FOREIGN PATENT DOCUMENTS

| CN | 113296012 A | 8/2021 |
| DE | 31 41 315 A1 | 4/1983 |

(Continued)

*Primary Examiner* — Raul J Rios Russo
*Assistant Examiner* — Trung Q Nguyen
(74) *Attorney, Agent, or Firm* — Timothy W. Menasco, Esq.; Harter Secrest & Emery LLP (57) ABSTRACT

Apparatus (100) and method for testing cell contact of battery cells (102) of a battery module (104), which battery cells are electrically connected in parallel via a contacting system (106, 107). The apparatus includes a sensor positioning system (108) for positioning a sensor device (110) at a plurality of test points (112) of the battery module, which is movable along a longitudinal axis (X), a transverse axis (Y), and a vertical axis (Z), and a current generation circuit (114) for generating a battery cell current (I), which is a discharging current from the battery cell or a charging current into the battery cell. The sensor device includes at least one field sensor (118), which, after the sensor device is positioned at one of the test points, detects a field in the region of the test point, which is generated by the battery cell current generated with the current generation circuit.

13 Claims, 8 Drawing Sheets

(51) Int. Cl.
  *G01R 31/389* (2019.01)
  *G01R 31/66* (2020.01)
  *G01R 33/06* (2006.01)
  *H01M 10/42* (2006.01)
  *H01M 10/48* (2006.01)

(52) U.S. Cl.
  CPC ........... *G01R 31/66* (2020.01); *G01R 33/066* (2013.01); *H01M 10/4285* (2013.01); *H01M 10/482* (2013.01)

(58) Field of Classification Search
  USPC .. 324/415, 425–435, 126, 756.05, 538, 200, 324/207.13, 233, 256, 515, 500–530, 324/76.11
  See application file for complete search history.

(56) References Cited

U.S. PATENT DOCUMENTS

| | | | |
|---|---|---|---|
| 2016/0329615 A1* | 11/2016 | Bergmann | H01M 50/103 |
| 2017/0269142 A1 | 9/2017 | Dehkordi et al. | |
| 2020/0083513 A1* | 3/2020 | Lejosne | H01M 10/613 |
| 2021/0173012 A1* | 6/2021 | Subbotin | G01R 31/3842 |
| 2022/0057452 A1* | 2/2022 | Gorbold | G01R 31/3167 |

FOREIGN PATENT DOCUMENTS

| | | |
|---|---|---|
| DE | 11 2014 000 982 T5 | 11/2015 |
| EP | 2 703 830 A2 | 3/2014 |
| EP | 3114491 B1 | 10/2019 |
| JP | 2012169244 A | 9/2012 |
| JP | 2023055143 A | 4/2023 |
| WO | 2021044155 A1 | 3/2021 |
| WO | 2021044169 A1 | 3/2021 |

* cited by examiner

APPARATUS AND METHOD FOR TESTING A CELL CONTACT OF BATTERY CELLS OF A BATTERY MODULE

The present invention relates to an apparatus for testing a cell contact of battery cells of a battery module. The present invention also relates to a method for testing a cell contact of battery cells of a battery module.

Battery modules are known in principle. Battery modules are used, for example, for electric vehicles using commercially available lithium-ion batteries. Battery modules are formed from a plurality of batteries, which are referred to below as battery cells. The battery cells are produced, for example, in AA format and then connected in parallel (parallel circuit) in order to form a battery module from, for example, 500 individual battery cells. In order to achieve a required operating voltage, it is also known to connect the battery cells in series (series circuit).

Larger battery modules, such as those used in electric vehicles or in temporary energy storage devices, have a very large number of battery cells connected in parallel and/or in series. This causes problems in the tests required after the battery module is manufactured.

It is also known to connect the battery cells of a battery module in parallel via busbars. Various connection techniques are known for connecting the battery cells to the busbar. For example, it is known to solder or weld the battery cells at the contact points thereof, wherein known methods in the field of welding, for example laser or ultrasonic welding, are known for establishing electrical contact with the battery cells, for example with the busbars. It is also known to use clamp or plug connections as connecting means in order to establish contact with the battery cells. The connections between the battery cells and the corresponding busbars can therefore be established in a variety of ways. The contact points are also known as connection points, connection terminals, or terminals.

The busbar and the battery cells are not necessarily connected directly, but connecting conductors, for example in the form of connecting wires or cables, can also be provided in order to electrically connect the battery cells to the busbar via the connecting conductors. In order to connect a battery cell to a busbar, four electrical connections must accordingly be established when using a connecting conductor. A first connecting conductor is to be electrically connected to the anode contact (positive terminal) of the battery cell on a first side, and it is to be electrically connected to the busbar for the positive terminal of the battery cells on a second side. The same principle is carried out analogously for a second connecting conductor in order to electrically connect the cathode contact (negative terminal) and the busbar for the negative terminal of the battery cells.

It can happen that the electrical connection between the battery cells and the busbars is not electrically conductive or only poorly electrically conductive, for example because the welded, clamped, or plugged-in connection is inadequate. This is undesirable and can occur due to manufacturing and tolerance variations. Efforts are therefore being made to test the electrical contact points of the battery cells. Due to the plurality of contact points to be tested, which are referred to as test points, apparatuses are known for the automated testing of the cell contacts of the battery cells of the battery module. Such an apparatus is known, for example, from document EP 3 114 491 B1. Document EP 3 114 491 B1 describes an apparatus that works with a resistance measurement. The basic principle of the apparatus described therein is that the electric conductivity of the test points is tested by positioning two contact electrodes in pairs at a plurality of test points with an automated positioning system, and a resistance measurement is carried out between the two contact electrodes in order to determine the conductivity of the test point. If the resistance value is too high, a faulty test point or faulty electrical contact is assumed. The problem with the resistance measurement is that each contact point has to be tested individually with the resistance measurement. This is problematic because the overall testing process of all individual contact points is time-consuming. In addition, it is problematic that the contact electrodes for the resistance measurement have to be brought into direct electric contact with the test points, which necessitates precise positioning of the contact electrodes. The exact positioning is an especially big challenge because the contacts of the battery cells are not always arranged in the same position due to manufacturing and process variations in battery module manufacture, and the test points can therefore be in different places even with identical battery modules. This is counteracted with calibration methods or compliance with small manufacturing tolerances, which is expensive.

In addition, the contact electrodes must exert a certain amount of force on the test points to ensure that the electrodes are correctly positioned on the test points. It is understood that the contact electrodes can therefore also wear out and, if soiled, the test results may be incorrect.

The object of the present invention is therefore to address one of the problems mentioned above, to improve the general prior art, or to provide an alternative to what was previously known. In particular, a solution is to be provided with which the testing process of the cell contact of battery cells can be accelerated. In particular, a simpler and more robust testing system for testing the cell contact of battery cells is also to be provided.

In order to achieve this object, an apparatus for testing a cell contact of battery cells of a battery module as claimed herein is proposed.

A test apparatus is therefore proposed which is provided and configured for testing a cell contact of battery cells. Testing of the cell contact can also be understood as testing the contact points or connection points of the battery cells at which the battery cells have electrical contact. The battery cell can also be understood synonymously as a battery or as an accumulator (rechargeable battery). The battery cell is part of a battery module. The battery module is formed from a plurality of battery cells which are electrically contacted or connected to one another, for example the battery cells of the battery module are connected in parallel or in series. The test apparatus is therefore intended to test the proper electrical connection of a battery module, i.e. whether the electrical connection of the battery cells was properly established when the battery module was manufactured. If the cell contact of the battery cells takes place, i.e. the manufacture of an electrically conductive connection, for example with a laser welding process, the laser-welded connection points or points of the battery module are tested with the test apparatus.

It is proposed that several battery cells of the battery module are electrically connected to one another in parallel via a contacting system. Electrically connected in parallel in this case means that several negative terminals of the battery cells are electrically connected to one another, just as several positive terminals of the battery cells are electrically connected to one another. A contacting system is provided to connect the battery cells to one another. The contacting system is a system for establishing electrical contact between the battery cells. Additional components of the battery module can also be connected to the contacting system, such as a battery management system or protective circuits, for example for deep-discharge protection or short-circuit protection. The contacting system therefore relates to the electrical connection technology. For example, the contacting system is formed from several busbars connected in parallel and several connecting conductors which electrically conductively connect the busbars and the battery cells.

The test apparatus comprises a sensor positioning system for positioning a sensor device at a plurality of test points of the battery module, wherein the sensor positioning system for positioning the sensor device is designed to be movable along a longitudinal axis, a transverse axis, and a vertical axis. These axes span a three-dimensional space so that the sensor device can be moved to any point in space. The sensor positioning system is an automated system with which a sensor device is arranged or placed at the respective test point. The sensor positioning system is designed, for example, as described in the prior art in EP 3 114 491 B1, with several sensor fixtures that can be moved independently. With the sensor positioning system, several test points can be approached at the same time or several test points can be approached one after the other. The sensor positioning system thus positions the sensor device at all contact points of the battery module to be tested so that all test points can be tested with the sensor device. The positioning process is automated. In order to reach all test points, the sensor positioning system is designed to be movable and can move the sensor device along the transverse axis, the vertical axis, and the longitudinal axis. Movable can also be understood as displaceable or positionable. The sensor device can therefore be moved as desired in three-dimensional space with the sensor positioning system. The movement or displacement along the longitudinal axis can be understood as a movement forward or backward. The movement along the transverse axis can be understood as a movement to the left or right. The movement along the vertical axis can be understood as a movement up and down. The structure of the sensor positioning system is basically arbitrary; it can be designed with several movable sensor fixtures, for example, as described in EP 3 114 491 B1, but it can also be designed with an industrial robot or a three-axis movable sensor head, as in a 3D printer.

Each test point of the battery module is automatically approached with the positioning system, and the sensor device is arranged at all test points of the battery module to carry out a measurement. The positioning of the sensor device with the sensor positioning system can take place according to a fixed schedule that is stored, for example, in a control device of the test apparatus or in the sensor positioning system. Once testing is complete at a test point, the sensor positioning system positions the sensor device at one or more new test points.

The test apparatus preferably comprises a control device for controlling the sensor positioning system and for actuating the current generation circuit and is preferably connected to an evaluation device and/or the sensor device in terms of data technology. The control device is provided and configured to coordinate the test method, i.e. to coordinate the approach to the test points with the positioning system, to generate the battery current with the current generation circuit, and to coordinate the measurement process with the sensor device and the evaluation process with the evaluation device in terms of control technology.

The test apparatus also comprises a current generation circuit for generating a battery cell current, wherein the battery cell current is a discharging current from the battery cell or a charging current into the battery cell. It is therefore proposed that a technical device generates a current that is drawn from the battery cell or that is fed into the battery cell. The battery cell current is therefore an electric current that is generated by the battery cell. The battery cell thus works as a current source. The battery cell current can also be an electric current generated by another current source and then fed into the battery cell. It is understood that the battery cell current is direct current. It is also understood that the current generation circuit is connected to the battery cell or to the several battery cells in such a way that the discharging current or the charging current is established. The current generation circuit is electrically connected to the contacting system so that the battery cell to be tested can be discharged via the contacting system and the current generation circuit or so that the battery cell to be tested can be charged via the contacting system and the current generation circuit. It is understood that in the case of the discharging current, the battery cell is pre-charged. For discharging or charging, a closed circuit is established between the positive terminal and the negative terminal of the battery cell to be tested by means of the current generation circuit so that the battery cell current is established from or into the battery cell to be tested.

The test apparatus also comprises a sensor device that is designed with at least one field sensor. After the sensor device has been positioned at one of the test points, the field sensor is configured to detect a field in the region of the test point, which is generated by the battery cell current generated with the current generation circuit. Such a field arises when a current flows in the region of the test point. The field sensor can also be understood as a sensor head. It is known that an electric field is generated by charges at rest and in motion, and a magnetic field is generated by charges in motion. Charges in motion are also known synonymously as electric current. The field therefore refers to a magnetic field and/or an electric field since it is generated by the battery cell current, i.e. generated by charges in motion. The field sensor is therefore a sensor that is configured to detect a magnetic field and/or an electric field. After the sensor device has been positioned in the region of the test point, the field sensor detects a magnetic field and/or an electric field, which is generated by the battery cell current, wherein the battery cell current is generated with the current generation circuit. The magnetic field is characterized by a magnetic flux density (B) and a magnetic field strength (H). The electric field is characterized by an electric flux density (D) and an electric field strength (E). The field sensor can therefore be a magnetometer and/or an electric field meter, for example. Known magnetometers are, for example, Hall sensors, coils, Foerster probes, SQUIDs (superconducting quantum interference devices), proton magnetometers, or the like.

A test point is a point in the region of the battery cell to be tested at which the field generated by the battery cell current can be measured. Suitable test points are, for example, points in the immediate vicinity of the contact points of the battery cells, i.e. in the region of the anode and/or cathode connections of the battery cells. Another suitable test point is in the region of the connecting conductors which electrically connect the busbar and the battery cells. In addition, another suitable test point is a point in the region where a connecting conductor of the battery cell is connected to the busbar.

The field sensor is therefore designed for contactless detection of a magnetic field and/or electric field in the region of the test point.

It was recognized here that, instead of measuring the resistance as is known from the prior art, for example from EP 3 114 491 B1, measuring a magnetic field and/or electric field in the region of the test point is especially advantageous, since not every contact point must be tested individually on every battery cell. This takes advantage of the effect that no closed circuit is established between the positive terminal and the negative terminal of the battery cell to be tested if one of the two contact points on the battery cell to be tested has no or poor electrical contact. If the positive terminal or the negative terminal is not properly contacted, there is no or only a low battery cell current at the battery cell and accordingly no measurable field or only a small measurable field is induced. A single measurement can be used to determine whether the positive and negative terminals of the battery cells are properly connected to the contacting system. This also means that if, for example, busbars with connecting conductors are used as the contacting system, four contact points on the battery cells can be tested simultaneously with a single measurement; namely the connection between the positive terminal and a first connecting conductor; the connection between the first connecting conductor and the positive busbar, to which the positive terminals of the battery cells are connected; the connection between the negative terminal and a second connecting conductor; and the connection between the second connecting conductor and the negative busbar, to which the negative terminals of the battery cells are connected. With a resistance measurement method, all four test points on the battery cell would have to be tested individually. With the apparatus and procedure according to the invention, the duration of the test method is reduced. In addition, the field generated with the battery cell current is measured without contact, making the system less susceptible to contamination. In addition, the magnetic field and/or the electric field generated by the battery cell current extends over a spatially larger region, which means that the field sensor does not have to be positioned as precisely as with a resistance measurement, in which the contact points have to be reached.

The sensor device with the field sensor is preferably configured to detect a magnetic flux density and/or a magnetic field strength, and the apparatus is configured with an evaluation device to evaluate the detected magnetic flux density and/or the detected magnetic field strength. Accordingly, it is proposed to use a magnetic field sensor for detecting a magnetic field that is generated by the battery cell current. The advantage of this is that the magnetic flux density and the magnetic field strength are dependent on the amperage of the battery cell current, and thus magnetic fields of different strengths are generated at different battery cell currents. By evaluating the magnetic variables, conclusions can be drawn about the contact quality, because if there is a faulty electrical contact, for example, the resistance is higher and less current flows compared to a highly conductive contact. Accordingly, the magnetic field is lower with a faulty electrical contact than with a highly conductive contact. It is understood that the sensor device and the evaluation device are coupled to one another in terms of data technology for this purpose.

The sensor device with the field sensor is preferably configured to detect an electric flux density and/or an electric field strength, and the apparatus is configured with an evaluation device to evaluate the detected electric flux density and/or the detected electric field strength. Accordingly, it is proposed to use a field sensor for detecting an electric field that is generated in the region of the test point. The advantage of this is that the electric flux density and the electric field strength allow conclusions to be drawn about the electric potential present at the test point. By evaluating the electric field, conclusions can be drawn about the contact quality and the electric potential present at the battery contacts. It is understood that the sensor device and the evaluation device are coupled to one another in terms of data technology for this purpose.

The battery cells are preferably electrically pre-charged, and the current generation circuit is designed as a discharging circuit with a load resistor for discharging the pre-charged battery cells via the contacting system in order to generate the battery cell current as a discharging current between contact points of the battery cells. In this case, the battery cell or the battery cells work as a current source for generating the battery cell current. The current generation circuit establishes a closed circuit between the positive terminal and the negative terminal of the battery cells so that the battery cells are discharged via the contacting system and the load resistor. The load resistor is designed to be controllable, for example, and the contact points of the battery cells can be electrically conductively connected using the load resistor via a controllable switch. The connection points for contacting the battery cell are understood to be contact points, for example the connection points for the positive terminal and the negative terminal. The battery cells can be pre-charged outside of the test apparatus and before the test method. Optionally, this pre-charging can also be provided as part of the test method, wherein this pre-charging can also take place immediately after the battery cells have been manufactured and at a time interval from the further steps of the test method. An electrically pre-charged state is present when the battery cell is at least partially electrically charged, and the battery cell current can be drawn from the battery cell as a discharging current.

The battery cells are preferably electrically chargeable, and the current generation circuit is designed as a charging circuit for charging the battery cells via the contacting system in order to generate the battery cell current as a charging current between contact points of the battery cells. In this case, the battery cell or the battery cells function as an electrical storage device into which the generated battery cell current is fed. The current generation circuit creates a closed circuit between the positive terminal and the negative terminal of the battery cells so that the battery cells can be charged via the contacting system. In addition, the current generation circuit comprises a current source or energy source in order to generate the battery cell current, which is fed into the battery cells operating as energy storage devices. The battery cells can be charged with the test apparatus during the test. The current source or energy source for charging the battery cells can be, for example, a rectified mains voltage from an electric supply network. The charging circuit can also be understood as a battery charger. Battery chargers are known in principle.

The field sensor preferably has at least two sensors, wherein one of the sensors is designed to detect a field generated in the region of an anode contact point of the battery cell, and another sensor is designed to detect a field generated in the region of a cathode contact point, in particular to simultaneously test the field at the anode contact point and at the cathode contact point of the battery cell. It is therefore proposed to arrange at least two sensors on a sensor head, with which sensors the contact point on the anode and on the cathode of the battery cell can be tested at the same time. The cathode contact point refers to the negative terminal or the cathode connection of the battery cell. The anode contact point refers to the positive terminal or the anode connection of the battery cell. In a particular embodiment, the two sensors are arranged in pairs opposite one another and at a distance from one another. If two sensors are provided for the field sensor, it is advantageously achieved that the detected field in the region of the anode contact point can be compared with the detected field in the region of the cathode contact point. In addition, the two detected signals can be averaged to compensate for measurement inaccuracies, and the use of two sensors increases the measuring range, which means that the sensor does not have to be positioned as precisely. The distance between the sensors is preferably selected in such a way that it corresponds to the distance between the anode contact point and the cathode contact point. For variable usability, it is preferred if this distance is designed to be adjustable. For this purpose, the sensors can be held in a displaceable manner, for example.

The field sensor is preferably designed with a Hall sensor and/or with an electric coil. It is therefore proposed to design the field sensor as a magnetic sensor. Hall sensors and electric coils for measuring a magnetic field are known in principle. These two sensor types are especially robust and fail-safe.

The sensor device preferably has a plurality of field sensors in order to test several test points of the battery module simultaneously, each with a field sensor, wherein the plurality of field sensors is attached to a sensor fixture of the positioning system. The sensor fixture is designed to be movable along the longitudinal axis, the transverse axis, and the vertical axis in order to move the plurality of field sensors simultaneously. It is therefore proposed to use a plurality of measuring heads in order to test several test points in parallel and at the same time. This reduces the duration of the battery module test method. The sensor fixture is a mount or support structure to which the field sensors or the sensor device is attached. The sensor device is thus mechanically connected to the plurality of field sensors with the sensor fixture so that a movement of the sensor fixture has a direct effect on the sensor device. The plurality of field sensors attached to the sensor fixture is thus moved simultaneously. The sensor fixture is part of the sensor positioning system and is therefore designed to be movable, as described above. In this case, it can preferably be provided that the field sensors of a sensor device are arranged on the sensor fixture at a variable distance relative to one another. As a result, the sensor device can be used flexibly for different battery modules in that the field sensors are spaced apart from one another in such a way that they correspond to the pattern of the contact points to be tested. In this way, the device can be used in an adapted manner for different types of battery modules.

The positioning system preferably has several sensor fixtures, each of which can be moved independently of one another along a longitudinal axis, a transverse axis, and a vertical axis, and wherein a plurality of field sensors is attached to each sensor fixture in order to test several test points on the battery module. It is therefore proposed that the positioning system has several sensor fixtures that can be moved independently of one another and to which a plurality of field sensors or sensor heads is attached in each case. For example, sensor fixtures that can be moved independently of one another can be used with a plurality of field sensors. In this way, a plurality of test points can be tested independently of one another at the same time. This reduces the duration of the battery module test method. The plurality of field sensors is arranged at a distance from one another and are fixed to the fixture and preferably have a distance from one another which is matched to a distance between the battery cells. It is therefore proposed that a distance dimension between the field sensors matches a distance dimension between the battery cells. The distance between the field sensors is therefore adjusted to the distance between the battery cells. As already indicated above, it is advantageous if this distance can be changed in order to test different battery modules.

Preferably, the test apparatus comprises an evaluation device for evaluating the field detected in the region of the test point, wherein the evaluation device is configured to determine and/or optically display a contacting quality on the basis of the detected field. The evaluation device preferably has an optical display with which an evaluation result can be displayed. It is therefore proposed to provide an evaluation device which evaluates the sensor signals. For this purpose, the evaluation device can have an evaluation algorithm that is implemented as a computer program in the evaluation device. The result of the evaluation can be a characteristic value for the contacting quality. If the specific characteristic falls below a predetermined threshold value, for example, a faulty contact point is inferred and an error is displayed or reported.

In an especially preferred embodiment, the evaluation device is configured to determine a contacting quality of the cell contact at the test point or at several test points by evaluating the detected flux density and/or the detected field strength. The flux density and field strength relate to both the magnetic field and the electric field. It is therefore proposed that the evaluation device evaluates the flux density and/or the field strength in terms of signals or data. An evaluation can include a comparison or a signal analysis. The detected flux density and/or field strength can then be set as related to other measurements or reference values in order to draw conclusions about the quality of the cell contact.

The evaluation device preferably has a comparison database in which comparison data are stored, and the evaluation device is configured to compare the detected flux densities and/or field strengths with the comparison data in order to draw conclusions about the contacting quality. It is understood that the evaluation device has a data storage device for this purpose. The comparison database comprises, for example, comparison values for the flux densities and/or field strengths. A computer program or an algorithm, for example, is stored in the evaluation device, which compares the detected field strength and/or flux density with the database.

A method for testing a cell contact of the battery cells of a battery module is proposed as a further aspect according to the invention. The method comprises the following steps: providing a battery module, wherein the battery module has several battery cells electrically connected in parallel via a contacting system; positioning a sensor device at least at one test point of the battery module with a sensor positioning system; generating a battery cell current between contact points of the battery cells by discharging the battery cells or by charging the battery cells; detecting a field in the region of the at least one test point, which is generated by the generated battery cell current; and evaluating the detected field to determine a contacting quality of the cell contact at the at least one test point.

The battery module provided can be pre-charged or uncharged. In addition, the battery cells of the battery module can also be connected in series in order to set a predetermined battery output voltage of the battery module. The sensor positioning system is designed as described above or below. The battery cell current is generated with a current generation circuit, as described above or below. A field in the region of the at least one test point is detected using a sensor device with at least one field sensor, as described above or below. The field refers to a magnetic field and/or an electric field.

The method is preferably carried out using an apparatus for testing a cell contact of the battery cells of a battery module according to one of the above embodiments.

The explanations, definitions, and advantages described for the test apparatus apply analogously to the test method described above.

The present invention will now be explained in more detail below by way of example using exemplary embodiments with reference to the accompanying figures, wherein the same reference numerals are used for identical or similar components.

Figure 1:
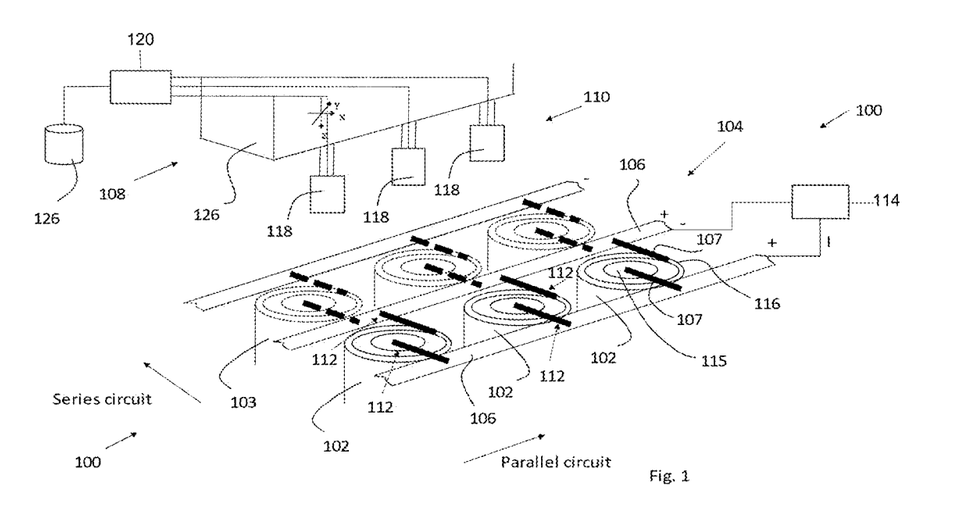
FIG. 1 schematically shows a perspective view of a test apparatus according to the invention in one embodiment.

FIG. 1 shows an apparatus 100 for testing a cell contact of the battery cells 102 of a battery module 104, in which several battery cells 102 of the battery module 104 are electrically connected in parallel via a contacting system 106, 107. The contacting system is formed at least from a first busbar 106 for the positive connection points 115 (positive terminal) of the battery cells 102 and formed from a second busbar 106 for the negative connection points 116 of the battery cells 102. The busbars 106 have electrical contact with the battery cell via connecting conductors 107, i.e. they are electrically conductively connected. As can be seen from FIG. 1, the three battery cells 102 are electrically connected in parallel. The contact points 115, i.e. the positive terminals of the battery cells 102, are each connected to a busbar 106 via a connecting conductor 107. In addition, the contact points 116, i.e. the negative terminals of the battery cells 102, are likewise connected to a busbar 106 via a connecting conductor 107. The three battery cells 102 shown are examples of a plurality of battery cells of the battery module 104. In addition, the dashed lines in FIG. 1 indicate that further battery cells 103, which are connected in series with the battery cells 102, for example, can also be part of the battery module 104. The battery cells 103 are connected in series in order to set a desired output voltage at the battery module 104 since the voltages of the individual battery cells are added due to the series circuit of battery cells 102 and 103.

The contacting system is therefore formed from busbars 106 and connecting conductors 107, and it serves the purpose of electrically conductively connecting the battery cells 102 and optionally the further battery cells 103.

Contact points 115 and 116, i.e. the positive terminal and negative terminal of the battery cells 102, are arranged on the same side. It is also known that the positive terminal 115 and negative terminal 116 are arranged on opposite sides of the battery cells 102, as is known from commercially available batteries.

The test apparatus 100 additionally comprises a sensor positioning system 108 for positioning a sensor device 110 at a plurality of test points 112 of the battery module 104, wherein the sensor positioning system for positioning the sensor device is designed to be movable along a longitudinal axis X, a transverse axis Y, and a vertical axis Z. The test points 112 are illustrated in more detail in FIG. 6.

The sensor device 110 has a plurality of field sensors 118 in order to test several test points 112 of the battery module 104 simultaneously, each with a field sensor 118. The plurality of field sensors 118 is attached to a sensor fixture 126 of the positioning system 108. The sensor fixture 126 is designed to be movable along the longitudinal axis X, the transverse axis Y, and the vertical axis Z in order to move the plurality of field sensors 118 simultaneously. Thus, the sensor fixture 126 can be lowered or raised, it can be moved to the right and left, and it can be moved forward and backward. This is illustrated with the indicated coordinate system. The plurality of field sensors 118 is arranged at a distance from one another and are fixed to the fixture 126 and have a distance from one another which is matched to a distance between the battery cells 102. It is therefore proposed that a distance dimension between the field sensors 118 matches a distance dimension between the battery cells 102 so that several test points 112 can be approached simultaneously. For example, the three battery cells 102 shown can be tested simultaneously with the three field sensors 118 shown.

Figure 7:
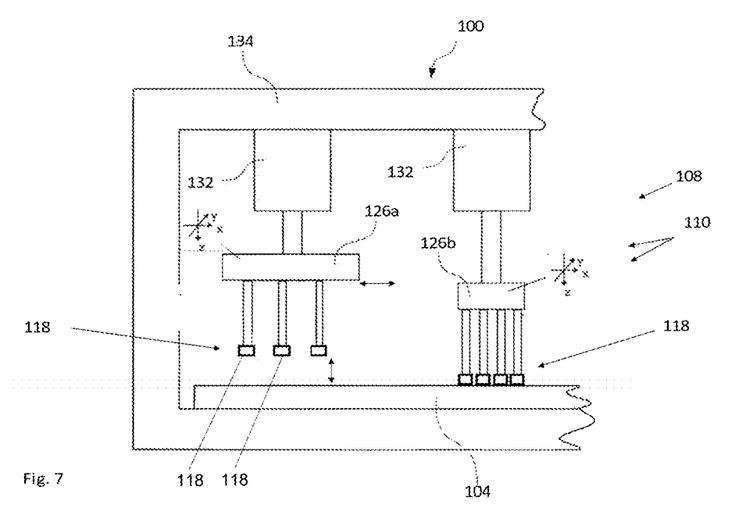
FIG. 7 schematically shows a sensor positioning system for positioning a sensor device with a plurality of field sensors and two sensor fixtures that can be moved independently of one another.

Only one sensor fixture 126 is shown in FIG. 1; however, the positioning system 108 can also have several sensor fixtures 126, each of which can be moved independently of one another along a longitudinal axis X, a transverse axis Y, and a vertical axis Z; and a plurality of field sensors 118 can be attached to each of the sensor fixtures in order to test several test points 112 on the battery module 104. This is shown in FIG. 7, for example.

The test apparatus 100 also comprises a current generation circuit 114 for generating a battery cell current, wherein the battery cell current I is a discharging current from the battery cell 102 or a charging current into the battery cell 102. The current generation circuit 114 is shown in more detail in FIG. 3 or 4, for example. The current generation circuit 114 is connected to the battery cells in such a way that the battery cell current I is established. In FIG. 1, the current generation circuit 114 is connected to the positive and negative busbars 106.

The test apparatus 100 also comprises the sensor device 110 that is designed with at least one field sensor 118. Three field sensors 118 are shown as an example in FIG. 1. After the sensor device 110 has been positioned at a test point 112, the field sensor 118 is configured to detect a field in the region of the test point 112, which is generated by the battery cell current I generated with the current generation circuit 14. This principle is illustrated in more detail in FIGS. 2 to 6.

The sensor device 110 is configured with the field sensor 118, for example, to detect a magnetic flux density B and/or a magnetic field strength H, and/or the sensor device 110 is configured with the field sensor 118 to detect an electric flux density D and/or an electric field strength E.

The test apparatus 100 is configured with an evaluation device 120 to evaluate the detected magnetic flux density B and/or the magnetic field strength H of the detected field and/or to evaluate the detected electric flux density D and/or the electric field strength E of the detected field.

The apparatus 100 thus has an evaluation device 120 for evaluating the field detected in the region of the test point 112.

The evaluation device 120 is configured to determine a contacting quality of the cell contact at the test point 112 or at several test points 112 by evaluating the detected flux density B, D and/or the detected field strength H, E.

The evaluation device 120 can additionally have a comparison database 126 in which comparison data are stored in order to compare the detected flux densities and/or field strengths with the comparison data and in order to draw conclusions about the contacting quality. For example, if no or only a low field strength is measured, a contact error can be assumed.

The field sensor 118 is designed with a Hall sensor and/or with an electric coil in order, for example, to detect a magnetic field.

A control device is shown, not in FIG. 1, which is configured for controlling the sensor positioning system and for actuating the current generation circuit and which is connected to an evaluation device and the sensor device in terms of data technology. The control device is provided and configured to coordinate the test method, i.e. to coordinate the approach to the test points with the positioning system 108, to generate the battery current I with the current generation circuit 114, and to coordinate the measurement process with the sensor device 110 and the evaluation process with the evaluation device 120 in terms of control technology.

Figure 2:
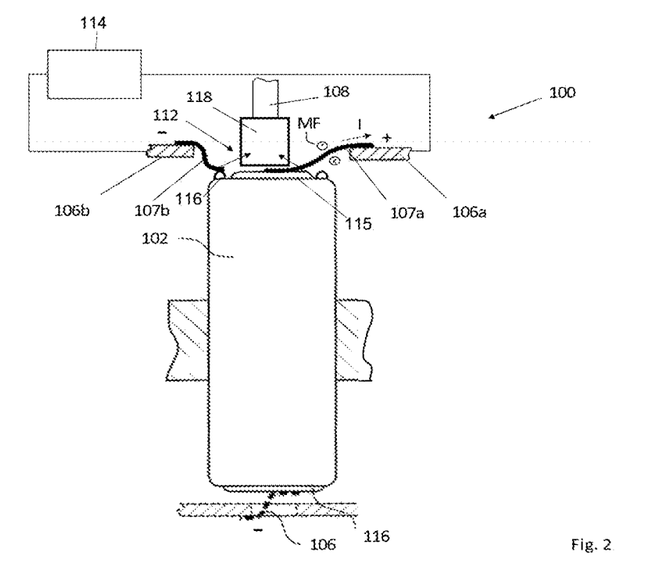
FIG. 2 schematically shows a battery cell of a battery module and a positioning of a field sensor in the region of a test point.

FIG. 2 schematically shows a battery cell 102 of a battery module 104 and a positioning of a field sensor 118 in the region of a test point. The field sensor 118 was thus positioned in the region of the test point 112 with the sensor positioning system 118. In the case shown, the test point 112 is a test point that is located between contact points 115 and 116. This test point is advantageous since both a field in the region of contact point 115 and also in the region of contact point 116 can be detected. This is illustrated with the two dashed arrows.

A current generation circuit is shown in FIG. 2. The current generation circuit 114 generates a battery cell current I, which flows from the positive terminal of the battery 102 to the negative terminal 116 of the battery cell 102 in the example shown. The current generation circuit 114 thus generates a closed circuit between contact points 115 and 116. A magnetic field MF is generated due to the current flow. An annular magnetic field is generated around the connecting conductor 107, since this is a current-carrying conductor. According to the right-hand rule, a magnetic field forms, which is illustrated schematically as MF in FIG. 2. In this case, the magnetic field generated with the battery cell current I is only shown on the connecting conductor 107, which is connected to the positive busbar 106.

FIG. 2 also illustrates that the negative terminal of the battery cell 102 can also be arranged on the underside of the battery cell.

FIG. 2 additionally shows that, in order to connect the battery cell 102 to busbars 106, four electrical connections have to be established when using connecting conductors 107. The first connecting conductor 107a is electrically connected to the anode contact 115 (positive terminal) of the battery cell 102 on a first side, and it is electrically connected to the busbar 106a on a second side. The connection points can be laser-welded or ultrasonically welded, for example. Additional battery cells are connected in parallel with the anode contacts thereof on the busbar 106a, such as shown in FIG. 1. This manner of contacting is carried out analogously for the second connecting conductor 107b in order to electrically connect the cathode contact 116 (negative terminal) and the busbar 106b for the negative terminal of the battery cell 102. Overall, the battery cell 102 has thus been electrically contacted at four connection points. These connection points must be tested accordingly to see whether they are electrically conductive. Thus, a test is done to determine whether a properly working battery module is ready, in which all battery cells are properly contacted.

Figure 3:
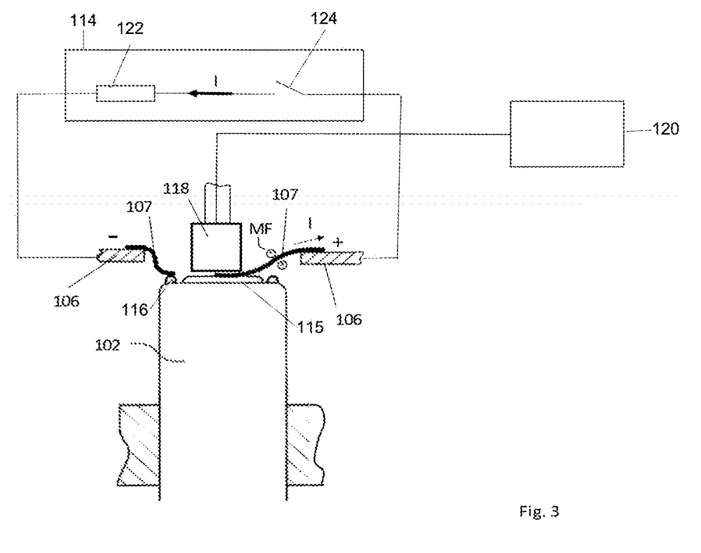
FIG. 3 schematically shows a battery cell of a battery module with a current generation circuit and an evaluation device in one embodiment.

FIG. 3 shows a current generation circuit 114 in an embodiment as a discharging circuit. The battery cell 102, which is an example of a plurality of further battery cells, is electrically pre-charged. It is sufficient here to only partially charge or pre-charge the battery cell 102, for example to 10% to 20% of the maximum storage capacity. The current generation circuit 114 is designed as a discharging circuit with a load resistor 122 for discharging the pre-charged battery cells via the contacting system 106 in order to generate the battery cell current as a discharging current between contact points 115, 116 of the battery cells 102. If the switch 124, which is designed to be controllable, is closed, a current I flows, namely the battery current or battery cell current, since a closed circuit is present. The battery cell current generates a magnetic field MF that can be detected with the field sensor 118. If one of the four connection points described for FIG. 2 was damaged or is non-conductive, the circuit would not be closed accordingly. If no field is measured in the region of the test point, one of the four contacts is defective. If only a small magnetic field is measured, it can be assumed that there is a poorly conducting electrical connection at one of the four connection points mentioned. In addition, the evaluation device 120, which is connected to the sensor head 118 in terms of data technology, is illustrated in FIG. 3.

Figure 4:
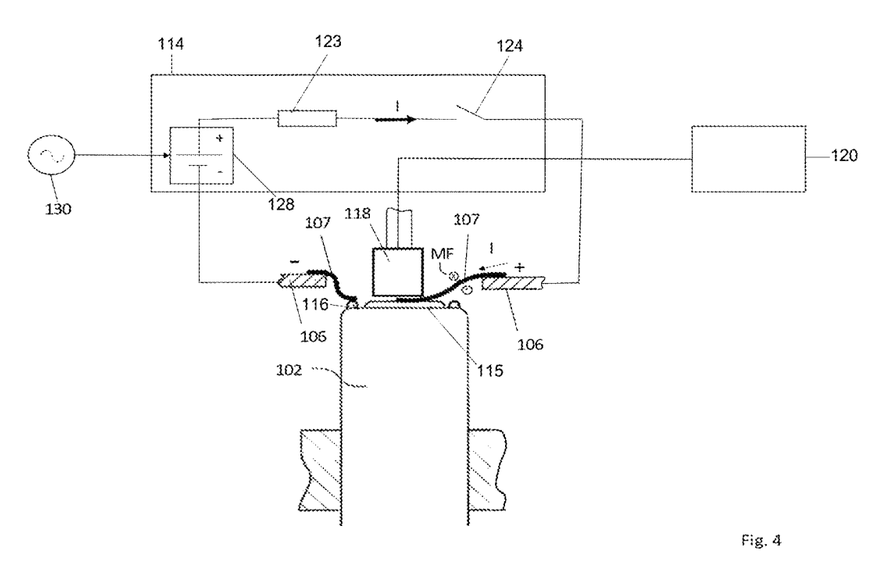
FIG. 4 schematically shows a battery cell of a battery module with a current generation circuit and an evaluation device in a further embodiment.

FIG. 4 shows a current generation circuit 114 in an embodiment as a charging circuit. The battery cell 102, which is an example of a plurality of further battery cells, is electrically discharged or partially charged i.e. not completely charged. The current generation circuit 114 has a direct current source 128 with which the battery cell current I is generated as a charging current. The direct current source 128 can be supplied from the electrical supply network 130, for example. It is understood that the direct current source 128 comprises a rectifier, since the electrical supply network 130 is an alternating current network, because the battery cells 102 are charged with a direct current and a direct voltage in a known manner. The charging current characterizes the current strength at which a rechargeable battery or the battery is charged. In addition, the current generation circuit 114 optionally has a charging resistor 123 in order to limit the charging current. The current generation circuit 114 is therefore designed to charge the battery cells 102 via the contacting system 106 in order to feed the battery cell current into the battery cells 102 as charging current. If the switch 124, which is designed to be controllable, is closed, a charging current I flows, namely the battery current or battery cell current, since a closed circuit is present. The battery cell current I generates a magnetic field MF that can be detected with the field sensor 118. If one of the four connection points described for FIG. 2 was damaged or is non-conductive, the circuit would not be closed accordingly. If no field is measured in the region of the test point during charging, one of the four contacts is defective. If only a small magnetic field is measured, it can be assumed that there is a poorly conducting electrical connection at one of the four connection points mentioned.

Figure 5:
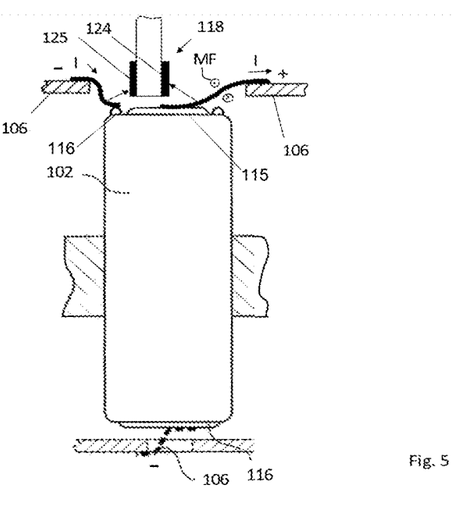
FIG. 5 schematically shows a battery cell of a battery module and a field sensor with two sensors in one embodiment.

FIG. 5 shows a field sensor 118 which is designed with two sensors 124, 125. The sensor 124 is designed to detect a field MF generated in the region of an anode contact point 115 of the battery cell 102, and the other sensors 125 are designed to detect a field MF generated in the region of a cathode contact point 116. The field MF is thus tested simultaneously at the anode contact point and the cathode contact point of the battery cell.

Figure 6:
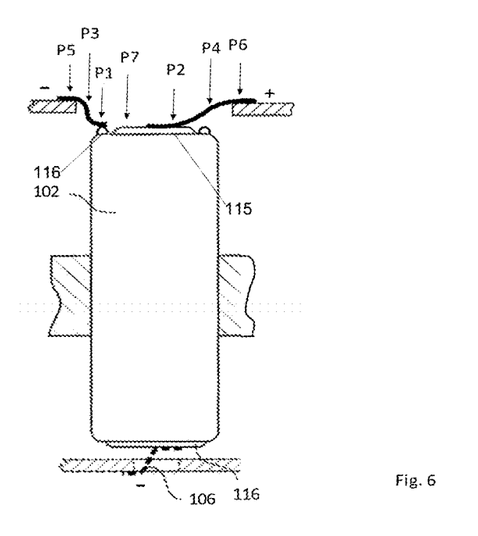
FIG. 6 schematically shows a battery cell of a battery module and several test points in the region of the battery cell.

FIG. 6 shows an example of where suitable test points can be provided on the battery cell 102. A test point is fundamentally a point in the region of the battery cell 102 to be tested, at which point the field MF generated by the battery cell current I can be measured. Suitable test points are, for example, points in the immediate vicinity of the contact points of the battery cells, i.e. in the region of the anode and/or cathode connections of the battery cells, for example test points P1 and/or P2. Another suitable test point is in the region of the connecting conductors which electrically connect the busbar and the battery cells, for example test points P3 and/or P4. In addition, another suitable test point is a point in the region where a connecting conductor of the battery cell is connected to the busbar, for example test points P5 and P6. In addition, a test point P7 can also be provided between the anode and the cathode connection.

FIG. 7 schematically shows a sensor positioning system 108 for positioning a sensor device 110 with a plurality of field sensors 118 and two sensor fixtures that can be moved independently of one another, which are designed to be movable with a drive device 134.

The sensor device 110 shown has a plurality of field sensors 118 in order to test several test points 112 of the battery module 104 simultaneously, each with a field sensor 118, wherein the field sensors 118 are attached to a sensor fixture 126a of the positioning system 108. The sensor fixture 126a is designed to be movable along the longitudinal axis L, the transverse axis Y, and the vertical axis Z in order to move the plurality of field sensors simultaneously.

In addition, FIG. 7 also shows that the positioning system 108 has several sensor fixtures 126a, 126b, each of which can be moved independently of one another along a longitudinal axis X, a transverse axis Y, and a vertical axis Z, and wherein a plurality of field sensors 118 is attached to each sensor fixture 126a, 126b in order to test several test points 112 on the battery module 104.

In addition, FIG. 7 shows that sensor fixtures 126a and 126b are designed with a drive device 132.

In order to support the drive device and sensor fixtures 126a and 126b, a support structure 134 can be provided which is formed from a structurally rigid material.

Figure 8:
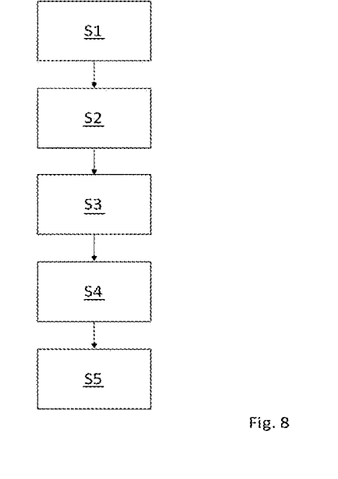
FIG. 8 schematically shows a flowchart of the test method according to the invention.

FIG. 8 schematically shows a method for testing a cell contact of the battery cells 102 of a battery module 104. The method comprises the following steps:

S1: Providing a battery module 104, wherein the battery module 104 has several battery cells 102 electrically connected in parallel via a contacting system 106, as shown in FIG. 1, for example.

S2: Positioning a sensor device 110 at least at one test point 112 of the battery module 104 with a sensor positioning system 108, as shown in FIG. 1 or 7, for example.

S3: Generating a battery cell current I between contact points 115, 116 of the battery cells 102 by discharging the battery cells 102 or charging the battery cells 102, as shown in FIGS. 2 to 4, for example.

S4: Detecting a field MF in the region of the at least one test point 112, which is generated by the generated battery cell current I, as shown in FIGS. 3 to 5, for example.

S5: Evaluating the detected field MF to determine a contacting quality of the cell contact at the at least one test point 112, as shown in FIG. 1, 3, or 4, for example.

LIST OF REFERENCE NUMERALS

100 Apparatus or test apparatus
102 Battery cell
104 Battery module
106 Busbar
107 Connecting conductor
108 Sensor positioning system
110 Sensor device
112 Test point
114 Current generation circuit
115 Contact point (positive terminal)
116 Contact point (negative terminal)
118 Field sensor
120 Evaluation device
122 Load resistor
124 Sensors
126 Sensor fixture
128 DC source
130 Supply network
132 Drive device
134 Support structure

The invention claimed is:

1. An apparatus for testing a cell contact of battery cells of a battery module that are electrically connected in parallel via a contacting system, the apparatus comprising:
 a sensor positioning system for positioning a sensor device at a plurality of test points of the battery module, wherein the sensor positioning system is configured to move the sensor device along a longitudinal axis (X), a transverse axis (Y) orthogonal to the longitudinal axis (X), and a vertical axis (Z) orthogonal to both the longitudinal axis (X) and the transverse axis (Y); and
 a current generation circuit for generating a battery cell current (I), wherein the battery cell current is a discharging current from the battery cell or a charging current into the battery cell;
 wherein the sensor device includes at least one field sensor, and
 wherein the field sensor is configured to detect a field in a region of one of the plurality of test points after the sensor device is positioned at the one of the plurality of test points, which is generated by the battery cell current (I) generated with the current generation circuit, wherein the field is a magnetic field or an electric field.

2. The apparatus according to claim 1, wherein:
 the sensor device with the field sensor is configured to detect a magnetic flux density (B) and/or a magnetic field strength (H), and wherein the apparatus is configured with an evaluation device for evaluating the detected magnetic flux density (B) and/or magnetic field strength (H) of the detected field; and/or the sensor device with the field sensor is configured to detect an electric flux density (D) and/or an electric field strength (E), and wherein the apparatus is configured with an evaluation device for evaluating the detected electric flux density (D) and/or the electric field strength (E) of the detected field.

3. The apparatus according to claim 1, wherein the battery cells are electrically pre-charged and the current generation circuit is a discharging circuit with a load resistor for discharging the pre-charged battery cells via the contacting system in order to generate the battery cell current as a discharging current between contact points of the battery cells.

4. The apparatus according to claim 1, wherein the battery cells are electrically chargeable and the current generation circuit is a charging circuit for charging the battery cells via the contacting system in order to generate the battery cell current as a charging current between contact points of the battery cells.

5. The apparatus according to claim 1, wherein the field sensor has at least two sensors, wherein one of the sensors is configured to detect a field generated in a region of an anode contact point of the battery cell, and another sensor is configured to detect a field generated in a region of a cathode contact point to simultaneously test the field at the anode contact point and at the cathode contact point of the battery cell.

6. The apparatus according to claim 1, wherein the field sensor comprises a Hall sensor and/or an electric coil.

7. The apparatus according to claim 1, wherein the sensor device has a plurality of field sensors for testing several test points of the battery module simultaneously, each of the several test points being tested with a separate one of the plurality of field sensors, wherein the plurality of the field sensors are attached to a sensor fixture of the positioning system, and wherein the sensor fixture is configured so as to be movable along the longitudinal axis (X), the transverse axis (Y), and the vertical axis (Z) in order to move the plurality of field sensors simultaneously.

8. The apparatus according to claim 1, wherein the positioning system has several sensor fixtures, each of which can be moved independently of one another along the longitudinal axis (X), the transverse axis (Y), and the vertical axis (Z), and wherein a plurality of field sensors are attached to each sensor fixture in order to test several test points on the battery module.

9. The apparatus according to claim 1, wherein the apparatus further comprises an evaluation device for evaluating the field detected in the region of the test point.

10. The apparatus according to claim 9, wherein the evaluation device is configured to determine a contacting quality of the cell contact at the test point or at several test points by evaluating detected flux density and/or detected field strength.

11. The apparatus according to claim 10, wherein the evaluation device further comprises a comparison database in which comparison data are stored, and the evaluation device is configured to compare the detected flux densities and/or field strengths with the stored comparison data for determining the contacting quality of the cell contact at the test point or at several test points.

12. A method for testing a cell contact of battery cells of a battery module that includes several battery cells electrically connected in parallel via a contacting system, the method comprising:

positioning a sensor device at least at one test point of the battery module with a sensor positioning system, wherein the sensor positioning system is configured to move the sensor device along a longitudinal axis (X), a transverse axis (Y) orthogonal to the longitudinal axis (X), and a vertical axis (Z) orthogonal to both the longitudinal axis (X) and the vertical axis (Z);

generating a battery cell current (I) between contact points of the battery cells by discharging the battery cells or charging the battery cells;

detecting a field (B) in a region of the at least one test point, which is generated by the generated battery cell current (I); and evaluating the detected field (B) to determine a contacting quality of the cell contact at the at least one test point, wherein the field is a magnetic field or an electric field.

13. The method according to claim 12, wherein the method is carried out using an apparatus comprising:

a sensor positioning system for positioning a sensor device at a plurality of test points of the battery module; and a current generation circuit for generating a battery cell current (I), wherein the battery cell current is a discharging current from the battery cell or a charging current into the battery cell;

wherein the sensor device includes at least one field sensor, and wherein the field sensor is configured to detect a field in a region of one of the plurality of test points after the sensor device is positioned at the one of the plurality of test points, which is generated by the battery cell current (I) generated with the current generation circuit.

* * * * *